United States Patent [19]

Sunderland

[11] Patent Number: 4,581,590

[45] Date of Patent: Apr. 8, 1986

[54] MULTIPLE POWER SUPPLY POWER AMPLIFIER CIRCUIT

[75] Inventor: Richard A. Sunderland, Aloha, Oreg.

[73] Assignee: Spacelabs, Inc., Chatsworth, Calif.

[21] Appl. No.: 669,298

[22] Filed: Nov. 8, 1984

[51] Int. Cl.$^4$ .............................................. H03F 3/16
[52] U.S. Cl. ..................................... 330/297; 330/300
[58] Field of Search ............... 330/277, 297, 300, 310, 330/311

[56] References Cited

U.S. PATENT DOCUMENTS

| | | | |
|---|---|---|---|
| 3,753,138 | 8/1973 | Svendsen | 330/295 |
| 3,772,606 | 11/1973 | Waehner | 330/267 |
| 3,961,280 | 6/1976 | Sampei | 330/267 |
| 3,974,455 | 8/1976 | Kamimura et al. | 330/300 X |
| 4,117,418 | 9/1978 | Hoglund | 330/296 |
| 4,158,179 | 6/1979 | Sakai et al. | 330/297 |
| 4,236,120 | 11/1980 | White | 330/296 |
| 4,319,199 | 3/1982 | Sunderland | 330/297 |
| 4,400,652 | 8/1983 | Sunderland | 315/387 |

OTHER PUBLICATIONS

International Electronics, McGraw-Hill, 11/9/78 entitled "X-Ray Lithography Breaking Through the Micron Line".

Primary Examiner—Eugene R. LaRoche
Assistant Examiner—Steven J. Mottola
Attorney, Agent, or Firm—Lawrence S. Levinson; Robert E. Lee, Jr.

[57] ABSTRACT

An amplifier circuit with serially coupled output stages coupled to different level voltage supplies wherein at least the higher voltage-supplied output stages comprise a field effect transistor (FET) device is disclosed. In one embodiment a floating power supply is coupled between $V_{in}$ and the gate of the FET to provide turn on of the FET at the proper crossover voltage. In another embodiment, control of the FET is provided by a transistor circuit which causes the FET to turn on in response to the instantaneous voltage drop across the lower voltage-supplied output stage.

11 Claims, 4 Drawing Figures

MULTIPLE POWER SUPPLY POWER AMPLIFIER CIRCUIT

BACKGROUND OF THE INVENTION

This invention relates to power amplifier circuits, and more specifically to a linear amplifier which minimizes power loss in its output devices.

It is well known that the power supply for an amplifier which directly drives a load must have a supply voltage at least slightly greater than the maximum output voltage required by the load. The difference between the supply voltage and the instantaneous load voltage appears across the amplifier's output devices. Because load current also flows through the output devices, there is consequent power loss through them. It is well understood that the efficiency of the amplifier increases as the load, or output, voltage approaches the supply voltage. In most amplifier applications, however, the load voltage varies and is less than maximum the majority of the time. Therefore, efficiency suffers the majority of the time as well. The common technique of using a class A amplifier powered by a supply voltage high enough to accommodate the highest expected output voltage exhibits this characteristic.

It has been recognized in the prior art that for an amplifier to drive a load efficiently at both high and low output voltages, the amplifier must be able to supply load current from a low voltage supply for low output voltages and from a higher voltage supply only during higher output voltages. This reduces the voltage drop across the amplifier output devices and, thus, improves its efficiency.

Prior art multi power supply amplifier circuits are disclosed in an article by Jerome Leiner in "Electronics Magazine", Nov. 9, 1978, page 114; U.S. Pat. No. 3,772,606; U.S. Pat. No. 3,961,280; and U.S. Pat. No. 4,319,199. However, even these approaches have problems with supply crossover distortion and turn-on and turn-off delays in the transistors at high speed, that is, at speeds in excess of, for example, 25 kHz.

SUMMARY OF THE INVENTION

An amplifier circuit is provided including at least two serially coupled output stages coupled to different voltage level power supplies wherein at least all of the higher voltage-supplied output stages comprise a field effect transistor device FET. In one embodiment, control means in the form of a floating power supply coupled between the input voltage and the gate of the FET is provided for turning the FET on at the desired crossover voltage.

In another embodiment the control means comprises a transistor circuit having a controlling transistor responsive to the instantaneous voltage drop across the lowest voltage-supplied output device. When the controlling transistor turns on, it turns the FET on at the proper crossover voltage. In this embodiment the control means is independent of variations in the FET threshold voltage. A floating power supply coupled between the output voltage and the controlling transistor circuit provides supply current and bias voltages for the controlling circuit.

DETAILED DESCRIPTION OF THE DRAWINGS

Figure 1:
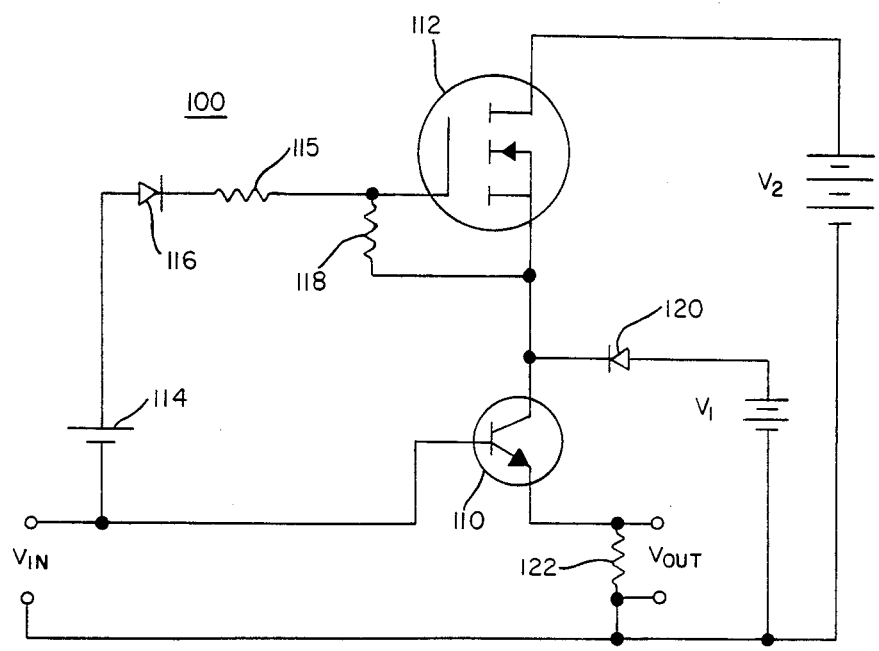
FIG. 1 is a basic amplifier output circuit utilizing the present invention.

The present invention utilizes output devices which are in series and are selectively enabled so that the higher level power supply contributes to the load current only as needed. FIG. 1 illustrates a basic circuit designated generally 100 according to the invention. The input signal $V_{in}$ is coupled directly to the base of transistor 110 and to the gate of the field effect transistor device (MOSFET) 112 via floating supply 114 (approximately 5 volts), resistor 115 and diode 116. (Resistor 115 is recommended by the MOSFET manufacturer to prevent oscillations. It is of the order of 50–100 ohms.) The source of MOSFET 112 is coupled to the collector of transistor 110, and the gate of MOSFET 112 is coupled via resistor 118 to the source. The drain of MOSFET 112 is coupled to the positive side of power supply $V_2$ while the collector of transistor 110 is connected via diode 120 to the positive side of power supply $V_1$. The output voltage of power supply $V_2$ (e.g. 25 volts) is greater than the output voltage of power supply $V_1$ (e.g. 8 volts). $V_{out}$ is shown across a resistor load 122.

Transistor 110 is caused to turn on as soon as $V_{in}$ increases to overcome the diode drop from the base to emitter of the transistor 110. Power supply $V_1$ provides the current through transistor 110. The voltage at the collector of transistor 110 is approximately 7.2 volts in this example to accommodate the voltage drop through diode 120 at fairly high current.

Figure 3:
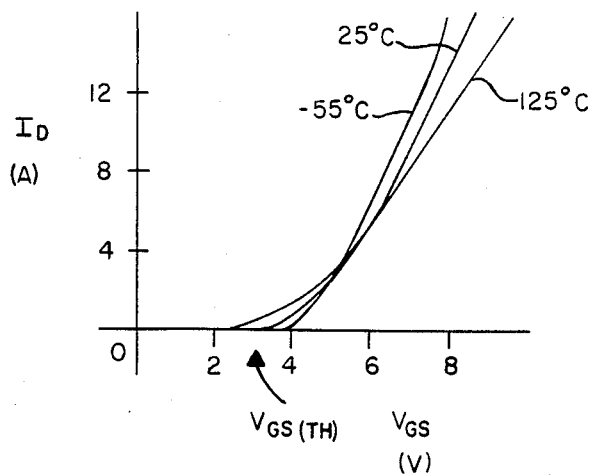
FIG. 3 is a transfer characteristic of an N-channel field effect transistor device.

At the same time the voltage at the gate of MOSFET 112 is $V_{in}$ plus the voltage of the floating power supply 114 less the sum of the drops across diode 116 and resistor 115. For slow to moderate rates of increase of $V_{in}$, the capacitive loading effect of the MOSFET's gate does not produce much voltage drop across resistor 115. The MOSFET 112 of the present design operates in the enhancement mode, i.e., at a gate to source voltage, $V_{GS}$, of zero volts or below, there is little or no drain current. However, as $V_{GS}$ approaches a threshold voltage (2.5 volts in the present design), the MOSFET begins to turn on. Turn on is not abrupt but gradual. See FIG. 3 which shows the relationship between drain current, $I_D$, and the gate to source voltage, $V_{GS}$, operating at three different temperatures. A typical threshold voltage is shown at $V_{GS(th)}$.

Initially the voltage at the source of MOSFET 112 is held at about 7.2 volts by power supply $V_1$. Until the gate voltage approaches 9.7 volts or greater ($V_{GS}+7.2$ volts) the drain current is very low. The value of the power supply 114 is chosen such that as $V_{in}$ at the base of transistor 110 approaches something less than the 7.2 volts present at the collector of transistor 110, the voltage at the gate of MOSFET 112 (i.e., $V_{in}$ plus the voltage of power supply 114 minus a 0.6 volt diode drop at diode 116) approaches 9.7 volts which is enough to turn MOSFET 112 on.

In the preferred embodiment (for a MOSFET $V_{GS(th)}$ of 2.5 volts) the voltage at power supply 114 is chosen as 5 volts. Hence, at $V_{in}$ equal to 5.3 volts, the voltage at the gate of MOSFET 112 is 9.7 volts. The MOSFET begins to turn on and some current flows from the 25 volt power supply $V_2$, through the drain of MOSFET 112, through transistor 110, to $V_{out}$. Under conditions where MOSFET 112 is on, but not sufficiently turned on to support all of the load current of load resistor 122, the collector of transistor 110 will remain at a nearly fixed voltage. This voltage will be equal to supply voltage $V_1$ minus the forward drop across diode 120 ($\cong 7.2$ volts in this example). Therefore, until MOSFET 112 can carry the whole load, its source terminal will remain at a fixed voltage and its gate terminal will rise by the same increment as an increase in $V_{in}$. Increasing the gate to source voltage of MOSFET 112 will cause it to draw more current from $V_2$. As the current from $V_2$ increases, the current through diode 120 from $V_1$ decreases. When the current from $V_2$ equals the current through the load, diode 120 will be off. The incremental change of $V_{in}$ between where MOSFET 112 is just at threshold and where it supports the entire load current depends on actual load current and the transfer characteristics of the actual MOSFET to be used. (For this example the increment is approximately 1 to 1.5 volts.) Further increases in $V_{in}$ will cause MOSFET 112 to carry the collector of transistor 110 above the fixed voltage it had been at, and then above the voltage of supply $V_1$. Diode 120 will be reverse biased then and allow the disconnection from $V_1$. For input voltages great enough to cause all load current to come from supply $V_2$, the collector-to-emitter voltage drop across transistor 110 remains approximately constant. The voltage of supply 114 is picked so that transistor 110 does not saturate under the conditions of MOSFET 112 supplying all load current, load current being at maximum, and assuming a worst case (i.e. maximum expected) gate-to-source voltage requirement of MOSFET 112. It is important to keep transistor 110 from saturating so that when the input voltage is reduced below the point where MOSFET 112 should be off, transistor 110 does not remain saturated and keep $V_{out}$ briefly at a voltage equal to $V_1$ minus the sum of the voltage drop across diode 120 plus the saturation voltage of transistor 110. Transistor 110 not saturating leads to greatly reduced distortion of $V_{out}$ under these conditions.

Because diode 116 is in series with supply 114, and because the gate input of MOSFET 112 is highly capacitive, for decreasing $V_{in}$, capacitive charge in the gate region of MOSFET 112 tends to cause MOSFET 112 to not turn off. Diode 116 becomes reverse biased for decreasing $V_{in}$ and thus is no help in turning off the MOSFET. To overcome this, the charge is allowed to dissipate through resistor 118 to equalize the voltage between gate and source, thus turning off 112.

In prior art designs, a bipolar transistor has been used for MOSFET 112. For sufficiently slow rates of increase of $V_{in}$, a bipolar transistor for MOSFET 112 will work reasonably well. However, when the rate of change of $V_{in}$ is great enough, the turn on delay of a bipolar transistor for MOSFET 112 can cause much distortion in $V_{out}$ during transition from the $V_1$ to $V_2$ supply. (This turn on delay is defind as the delay between applying a forward bias on its base-emitter junction until collector current begins to flow sufficiently.)

For MOSFET 112, drain current begins to flow sufficiently as soon as its gate-to-source bias reaches the threshold voltage. There is no additional time delay due to any intrinsic behavior of the MOSFET. The key concern remaining is the time required to charge the inherent gate capacitance of the MOSFET in order to force its voltage up to the threshold value. Resistor 115 slows this charging, but not by as much as the turn on delay of a bipolar transistor that might be suitable for MOSFET 112.

Because transistor 110 is in series with MOSFET 112, transistor 110 remains on regardless of whether $V_1$ or $V_2$ supplies load current. Therefore, the issue of problems with transistor 110's turn on or turn off delay during shifting between supply $V_1$ and $V_2$ does not arise. Another characteristic of the present invention is that input current does not change polarity during crossovers from one power supply to the other, and except for transients, the magnitude of the input current is equal to the base current of transistor 110.

Figure 2:
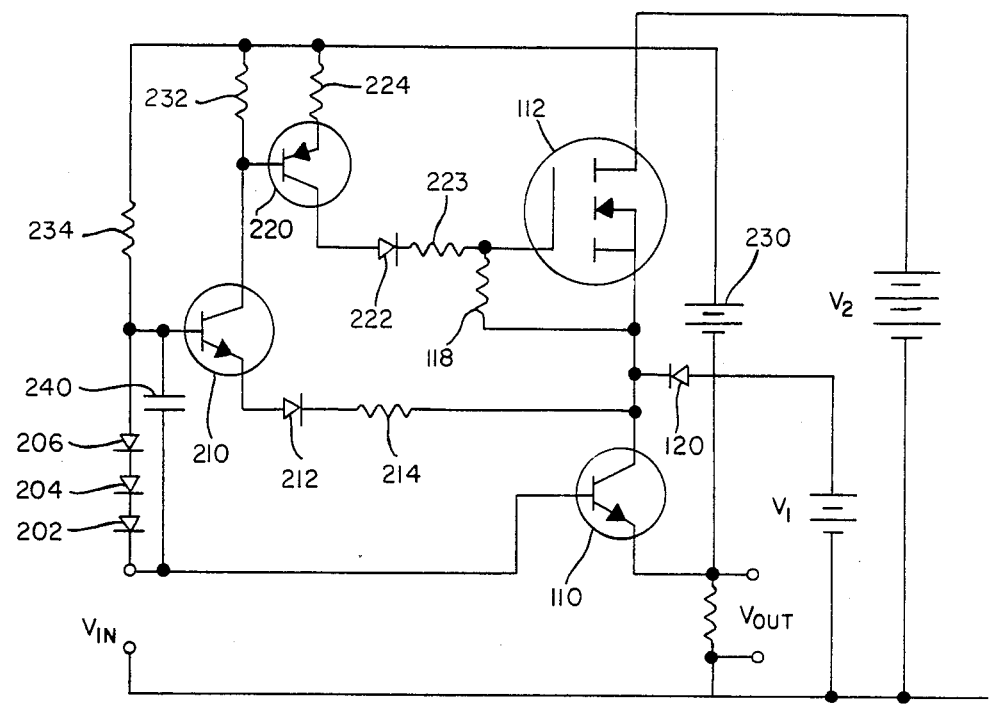
FIG. 2 is another embodiment of the present invention.

FIG. 2 shows an alternate design for the amplifier circuit of FIG. 1 which compensates for changes in the threshold voltage of MOSFET 112 due to temperature or manufacturing variations. As pointed out with respect to FIG. 1, the voltage of floating power supply 114 in combination with the threshold voltage, $V_{GS(th)}$, comprises the mechanism in FIG. 1 for turning the MOSFET on. However, it is more desirable to turn on the MOSFET based on the value of the instantaneous collector-to-base voltage of transistor 110 (i.e. how close to saturation is it) and to be independent of the threshold voltage.

Inspection of FIG. 2 will show that the output portion of the circuit is almost identical to the circuit of FIG. 1, and like devices are numbered accordingly. For example, $V_{in}$ is coupled to the base of transistor 110 whose emitter is coupled to $V_{out}$ and whose collector is coupled both to the source of MOSFET 112 and, through, diode 120, the positive side of power supply $V_1$. The drain of MOSFET 112 is coupled to the positive side of power supply $V_2$, where the magnitude of $V_2$ is greater than $V_1$. The gate of MOSFET 112 is coupled through resistor 118 to its source.

However, $V_{in}$ is also coupled through series-connected diodes 202, 204, and 206 to the base of transistor 210. The emitter of transistor 210 is coupled through diode 212 and resistor 214 in series to the collector of transistor 110, while the collector of transistor 210 is coupled to the base of transistor 220. The collector of transistor 220 is coupled through diode 222 and resistor 223 to the gate of MOSFET 112 while its emitter is coupled via resistor 224 to the positive side of a floating power supply 230 whose negative side is coupled to $V_{out}$. The base of transistor 220 is also coupled via resistor 232 to the positive side of power supply 230. The base of transistor 210 is also coupled to the positive side of supply 230 via resistor 234. Resistors 214, 224, 232 and 234 are all chosen to provide the proper bias voltages for operation of transistors 210 and 220.

In a manner similar to FIG. 1, it is desirable that MOSFET 112 begin to turn on at a $V_{out}$ which is slightly less than the voltage of $V_1$, yet low enough so that transistor 110 does not saturate. Continuing with the earlier example, assume $V_1$ is approximately 8 volts and $V_2$, 25 volts. While $V_{in}$ is less than $V_1$, the voltage at the collector of transistor 110 is approximately 7.2 volts due to the diode drop at 120. Accordingly, the voltage at the emitter of transistor 210 is approximately 7.8 volts when the diode 212 is forward biased. (Diode 212 has much lower current through it than diode 120, so diode 212's voltage drop is approximately 0.2 V less. This means that in order for transistor 210 to turn on, and therefore for transistor 220 to turn on, the base of transistor 210 must be approximately one diode drop higher than the emitter which is at 7.8 volts.

The base of transistor 210 is kept at three diode drops above $V_{in}$ or four diode drops above $V_{out}$. As $V_{in}$ and $V_{out}$ rise, the base voltage of transistor 210 rises. With 1.8 volts attributable to the diodes 202, 204 and 206 when $V_{in}$ reaches about 6.6 volts the base of transistor 210 will approach 8.4 volts and transistor 210 will turn on. This will turn on transistor 220 as well which in turn provides the necessary drive to FET 112 to turn it on. The floating power supply 230 provides the necessary bias voltages to transistors 210 and 220, and also provides current to hold a voltage drop across resistor 118, plus the transient current to quickly charge the gate capacitance of MOSFET 112. Having the aforementioned transient current come from $V_{out}$, rather than $V_{in}$, reduces the input current spike that could otherwise occur for fast positive transitions of $V_{in}$ above $V_1$. In the preferred embodiment supply 230 is approximately 11 volts. Hence, as $V_{in}$ approaches the $V_1$ power supply voltage, the circuit of FIG. 2 begins to turn on FET 112. Transistors 210 and 220 will increase the voltage across resistor 118 until MOSFET 112 can pull up the collector of transistor 110 enough to eliminate further increases in gate voltage. Circuit feedback makes its action nearly independant of the threshold voltage of FET 112.

Figure 4:
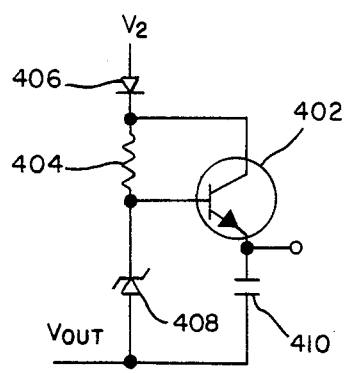
FIG. 4 is a more detailed schematic of a portion of the circuit of FIG. 2.

A more detailed description of the floating voltage supply 230 in FIG. 2 is provided in FIG. 4. The base of transistor 402 is coupled through resistor 404 and diode 406 to power supply $V_2$ and through Zener diode 408 to $V_{out}$. The collector of transistor 402 is also coupled through diode 406 to $V_2$. The emitter of transistor 402 provides the positive side of power supply 230. The voltage level of the emitter is determined by the voltage drop across Zener diode 408 and the base to emitter drop in transistor 402. The capacitor 410 between the emitter and $V_{out}$ provides low AC output impedance to the floating supply. It also serves to maintain the magnitude of the floating supply voltage during short time intervals when $V_{out}$ goes high enough so that diode 406 becomes reverse biased and can no longer provide current to transistor 402.

Capacitor 240 coupled between the base of transistor 210 and $V_{in}$ across the diodes 202, 204 and 206 ensures that the drop across these diodes remains fairly constant during transients of transistor 210's base current. In the preferred embodiment transistors 110 and 210 are n p n type, transistor 220 is a p n p type, while MOSFET 112 is an n channel power MOSFET.

It should be understood that a similar circuit can be constructed to accommodate negative signals as well as positive signals. Only the positive half of an amplifier circuit in accordance with the teachings of the present invention has been shown for clarity. Also, the magnitudes of supplies $V_1$ and $V_2$ and 230 can be altered without affecting the functionality of the invention, so long as $V_2 < V_1$ by approximately 2 volts or more, and 230 is great enough to always be able to turn on the FET.

I claim:

1. An amplifier circuit comprising:

an input terminal means for receiving a current proportional to an applied input signal having an input voltage associated therewith;

a first output stage connected to a first power supply voltage and having an input coupled to said input terminal means and an output coupled to a load for supplying output current to said load;

a second output stage connected to a second power supply whose voltage level is greater than said first power supply, said second output stage having an input coupled in parallel with said first output stage input to said input terminal means and an output coupled in series with said output of said first output stage for supplying output current to said load, said first and second output stages coupled in such a way that said output current of said second output stage passes through said first output stage, said second output stage comprising a field effect transistor (FET) device; and control means coupled to said second output stage for selectively activating said FET device to provide output current in response to said input signal voltage level.

2. The circuit of claim 1 wherein said first output stage comprises a FET device.

3. The circuit of claim 1 wherein said first output stage comprises a bipolar transistor.

4. The circuit of claim 1 wherein said control means comprises a separate floating power supply for said FET device coupled between said input terminal means and the gate of the FET device.

5. The circuit of claim 1 wherein said FET device is a metal oxide semiconductor FET (MOSFET).

6. The circuit of claim 5 wherein said MOSFET is a n channel MOSFET.

7. The circuit of claim 1 wherein said control means further comprises:

a control transistor for said FET device responsive to the difference between the first power supply voltage and the input voltage; and a drive transistor coupled to said control transistor for activating the FET device when said control transistor turns on.

8. The circuit of claim 7 wherein said control means further comprises:

a floating power supply coupled between said load and said control and drive transistors for providing bias voltages.

9. The circuit of claim 7 wherein said control transistor is coupled to said input terminal means in series with a plurality of diodes.

10. The circuit of claim 9 wherein said circuit further comprises a capacitor coupled in parallel with said diodes between said control transistor and said input terminal means.

11. The circuit of claim 8 wherein said floating power supply comprises a bipolar transistor whose base is coupled to said output terminal through a Zener diode and to said supply voltage connected to the output stage.

* * * * *